(12) United States Patent  
Kim

(10) Patent No.: US 11,756,607 B2  
(45) Date of Patent: *Sep. 12, 2023

(54) MEMORY CONTROLLER AND METHOD OF OPERATING THE SAME

(71) Applicant: SK hynix Inc., Icheon (KR)

(72) Inventor: Byung Jun Kim, Icheon (KR)

(73) Assignee: SK hynix Inc., Icheon (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/713,954

(22) Filed: Apr. 5, 2022

(65) Prior Publication Data

US 2022/0230675 A1 Jul. 21, 2022

Related U.S. Application Data

(63) Continuation of application No. 16/990,242, filed on Aug. 11, 2020, now Pat. No. 11,302,385.

(30) Foreign Application Priority Data

Feb. 21, 2020 (KR) ........................ 10-2020-0021710

(51) Int. Cl.

| | |
|---|---|
| G11C 11/4093 | (2006.01) |
| G11C 11/406 | (2006.01) |
| G11C 11/4076 | (2006.01) |
| G06F 12/0882 | (2016.01) |
| G11C 11/4099 | (2006.01) |

(52) U.S. Cl.  
CPC ...... *G11C 11/4093* (2013.01); *G06F 12/0882* (2013.01); *G11C 11/4076* (2013.01); *G11C 11/4099* (2013.01); *G11C 11/40626* (2013.01); *G06F 2212/7201* (2013.01)

(58) Field of Classification Search  
CPC ............ G11C 11/4093; G11C 11/4076; G11C 11/4099; G11C 11/40626; G06F 12/0882; G06F 2212/7201  
See application file for complete search history.

(56) References Cited

FOREIGN PATENT DOCUMENTS

| KR | 20150121562 A | 10/2015 |
|---|---|---|
| KR | 20180026993 A | 3/2018 |

*Primary Examiner* — Ajay Ojha

(57) ABSTRACT

An electronic device includes a memory controller and a memory device. The memory controller that controls the memory device includes a write buffer to temporarily store write data received from a host, a write timing controller to receive temperature information indicating a temperature of the memory device and generate write timing information based on the temperature information, the write timing information indicating a write timing at which the write data is transferred to and stored in the memory device, and a write operation controller to control the write buffer and the memory device based on the write timing information such that the write data stored in the write buffer is transferred to and stored in the memory device.

11 Claims, 15 Drawing Sheets

MEMORY CONTROLLER AND METHOD OF OPERATING THE SAME

CROSS-REFERENCE TO RELATED APPLICATION

The present application is a continuation of U.S. application Ser. No. 16/990,242 filed Aug. 11, 2020 and claims priority under 35 U.S.C. § 119(a) to Korean Patent Application Number 10-2020-0021710, filed on Feb. 21, 2020, in the Korean Intellectual Property Office, the entire disclosure of which is incorporated herein by reference.

BACKGROUND

Field of Invention

The present disclosure relates to an electronic device, and more particularly, to a memory controller and a method of operating the same.

Description of Related Art

A storage device is a device that stores data under the control of a host device such as a computer or a smartphone. A storage device may include a memory device in which data is stored and a memory controller controlling the memory device. The memory device may include a volatile memory device, a non-volatile memory device, or both.

A volatile memory device is a device that stores data only when power is supplied thereto and loses the stored data when the power supply is cut off. The volatile memory device includes a static random access memory (SRAM), a dynamic random access memory (DRAM), or the like.

A non-volatile memory device is a device that does not lose stored data even when the power supply is cut off. The non-volatile memory device includes a read only memory (ROM), a programmable ROM (PROM), an electrically programmable ROM (EPROM), an electrically erasable and programmable ROM (EEPROM), a flash memory, or the like.

SUMMARY

Embodiments of the present disclosure relate to a memory controller having temperature management performance, and a method of operating the same.

A memory controller according to an embodiment of the present disclosure controls a memory device. The memory controller includes a write buffer to temporarily store write data received from a host, a write timing controller to receive temperature information indicating a temperature of the memory device and generate write timing information based on the temperature information, the write timing information indicating a write timing at which the write data is transferred to and stored in the memory device, and a write operation controller to control the write buffer and the memory device based on the write timing information such that the write data stored in the write buffer is transferred to and stored in the memory device.

A method of operating a memory controller according to an embodiment of the present disclosure is a method of controlling a memory controller controlling a memory device. The method includes storing write data received from a host in a write buffer, receiving temperature information indicating a temperature of the memory device, determining a write timing indicating a time point at which the write data stored in the write buffer is to be transferred to and stored in the memory device based on the temperature information, and controlling the write buffer and the memory device such that the write data is transferred to and stored in the memory device according to the write timing.

According to the present technology, the memory controller having improved temperature management performance, and the method of operating the same are provided.

DETAILED DESCRIPTION

Specific structural or functional descriptions of embodiments according to the concept which are disclosed in the present specification or application are illustrated only to describe the embodiments according to the concept of the present disclosure. The embodiments according to the concept of the present disclosure may be carried out in various forms and the descriptions are not limited to the embodiments described in the present specification or application.

Hereinafter, embodiments of the present disclosure will be described with reference to the accompanying drawings such that those skilled in the art may easily implement the technical spirit of the present disclosure.

Figure 1:
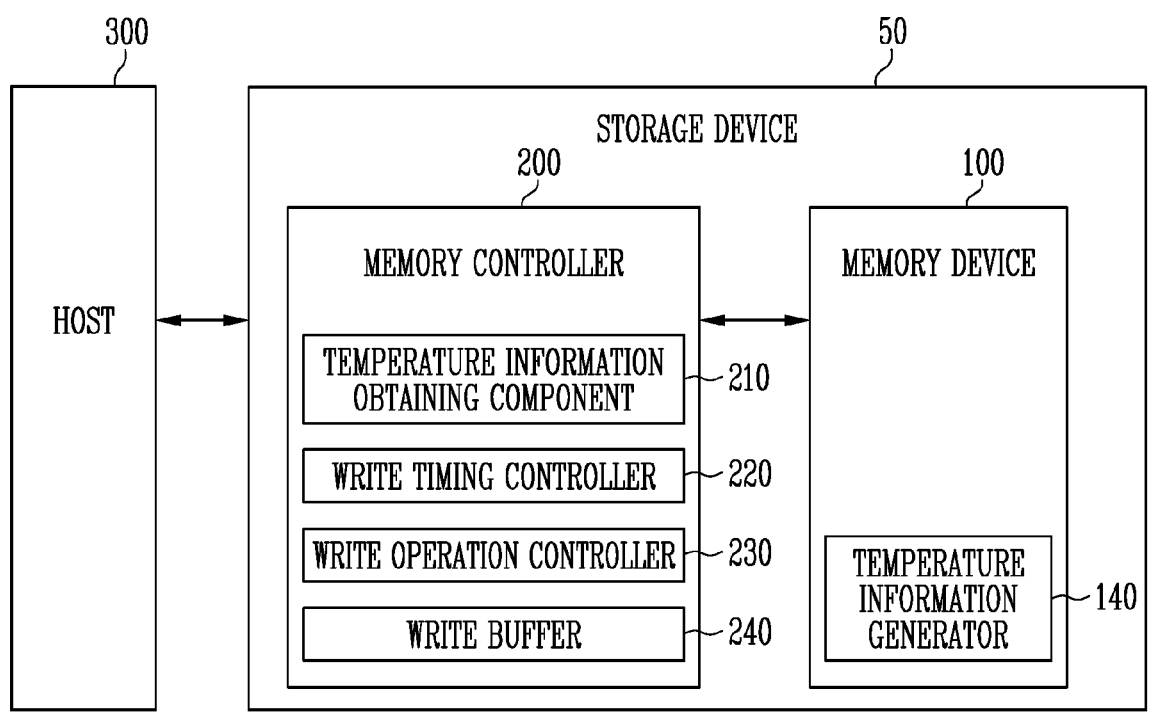
FIG. 1 illustrates a block diagram of a storage device according to an embodiment.

FIG. 1 illustrates a block diagram of a storage device 50 according to an embodiment.

Referring to FIG. 1, the storage device 50 may include a memory device 100 and a memory controller 200 controlling an operation of the memory device 100.

The storage device 50 may be a device that stores data under the control of a host 300. The host 300 may be a cellular phone, a smartphone, an MP3 player, a laptop computer, a desktop computer, a game player, a TV, a tablet PC, an in-vehicle infotainment system, or the like.

The storage device 50 may be one of various types of storage devices according to a host interface that is a communication method with the host 300. For example, the storage device 50 may be one of various types of storage devices such as an SSD, a multimedia card in the form of an MMC, an eMMC, an RS-MMC, or a micro-MMC, a secure digital card in the form of an SD, a mini-SD, or a micro-SD, a universal serial bus (USB) storage device, a universal flash storage (UFS) device, a personal computer memory card international association (PCMCIA) card type storage device, a peripheral component interconnection (PCI) card type storage device, a PCI express (PCI-E) card type storage device, a compact flash (CF) card, a smart media card, a memory stick, and so on.

The storage device 50 may be manufactured as one of various types of packages, such as a package on package (POP), a system in package (SIP), a system on chip (SOC), a multi-chip package (MCP), a chip on board (COB), a wafer-level fabricated package (WFP), a wafer-level stack package (WSP), or the like.

The memory device 100 may store data. The memory device 100 operates under the control of the memory controller 200. The memory device 100 may include a memory cell array including a plurality of memory cells that store data.

Each of the memory cells may be configured as a single level cell (SLC) storing one-bit data, a multi-level cell (MLC) storing two-bit data, a triple level cell (TLC) storing three-bit data, or a quad level cell (QLC) storing four-bit data.

The memory cell array may include a plurality of memory blocks. Each of the memory blocks may include a plurality of memory cells. One memory block may include a plurality of pages. In an embodiment, a page may be a unit for storing data in the memory device 100 or reading data stored in the memory device 100. A memory block may be a unit for erasing data stored in the memory device 100.

In an embodiment, the memory device 100 may be a double data rate synchronous dynamic random access memory (DDR SDRAM), a low power double data rate4 (LPDDR4) SDRAM, a graphics double data rate (GDDR) SDRAM, a low power DDR (LPDDR), a Rambus dynamic random access memory (RDRAM), a NAND flash memory, a vertical NAND flash memory, a NOR flash memory device, a resistive random access memory (RRAM), a phase-change memory (PRAM), a magnetoresistive random access memory (MRAM), a ferroelectric random access memory (FRAM), a spin transfer torque random access memory (STT-RAM), or the like. In the present disclosure, for convenience of description, it is assumed that the memory device 100 is a NAND flash memory.

The memory device 100 may receive a command and an address from the memory controller 200. The memory device 100 is configured to access a memory region in the memory cell array that is selected by the received address. Accessing the selected memory region means performing an operation corresponding to the received command on the selected memory region. For example, the memory device 100 may perform a write operation (or program operation), a read operation, or an erase operation according to the command. During the program operation, the memory device 100 may program data to the memory region selected by the address. During the read operation, the memory device 100 may read data from the memory region selected by the address. During the erase operation, the memory device 100 may erase data stored in the memory region selected by the address.

When power is applied to the storage device 50, the memory controller 200 may execute firmware (FW). The firmware FW may include a host interface layer (HIL) that receives a request from the host 300 or outputs a response to the request to the host 300, a flash translation layer (FTL) that manages an operation between an interface of the host 300 and an interface of the memory device 100, and a flash interface layer (FIL) that provides a command corresponding to the request to the memory device 100 or receive the response from the memory device 100.

The memory controller 200 may also receive data and a logical address (LA) from the host 300, and may convert the LA into a physical address (PA) indicating an address of memory cells in the memory device 100 in which the data is to be stored. The LA may be a logical block address (LBA), and the PA may be a physical block address (PBA).

The memory controller 200 may control the memory device 100 to perform the program operation, the read operation, or the erase operation according to the request of the host 300. During the program operation, the memory controller 200 may provide a program command, a PBA, and write data to the memory device 100. During the read operation, the memory controller 200 may provide a read command and a PBA to the memory device 100. During the erase operation, the memory controller 200 may provide an erase command and a PBA to the memory device 100.

The memory controller 200 may control the memory device 100 to perform the program operation, the read operation, or the erase operation by itself regardless of a request from the host 300. For example, the memory controller 200 may control the memory device 100 to perform the program operation, the read operation, or the erase operation used to perform a background operation such as wear leveling, garbage collection, or read reclaim.

The host 300 may communicate with the storage device 50 using at least one of various communication methods such as a universal serial bus (USB), a serial AT attachment (SATA), a serial attached SCSI (SAS), a high speed interchip (HSIC), a small computer system interface (SCSI), a peripheral component interconnection (PCI), a PCI express (PCIe), a non-volatile memory express (NVMe), a universal flash storage (UFS), a secure digital (SD), a multi-media card (MMC), an embedded MMC (eMMC), a dual in-line memory module (DIMM), a registered DIMM (RDIMM), a load reduced DIMM (LRDIMM), and so on.

In an embodiment, the memory device 100 may include a temperature information generator 140. The temperature information generator 140 may measure a temperature of the memory device 100 and generate the temperature information corresponding to the measured temperature. The temperature information may be a temperature code expressing the measured temperature as a digital code.

For example, the temperature information generator 140 may compare a temperature voltage Vtemp determined by the measured temperature of the memory device 100 with a preset reference voltage Vref, and may generate the temperature code according to a comparison result. Although the temperature information generator 140 is included in the memory device 100 as shown in FIG. 1, an embodiment of the present disclosure is not limited thereto. In another embodiment, the temperature information generator 140 may be included in the memory controller 200 or may be positioned in a space in the storage device 50 that is separate from the memory device 100 and the memory controller 200. For convenience of description, in the present disclosure, the temperature information generator 140 is included in the memory device 100 as shown in FIG. 1.

The memory controller 200 according to an embodiment may include a temperature information obtaining component 210, a write timing controller 220, a write operation controller 230, and a write buffer 240. In an embodiment, the temperature information obtaining component 210, the write timing controller 220, and the write operation controller 230 may be implemented using one or more processors included in the memory controller 200, and the write buffer 240 may be implemented using a memory included in the memory controller 200. In an embodiment, the temperature information obtaining component 210, the write timing controller 220, and the write operation controller 230 may be the firmware FW executed by the memory controller 200.

The temperature information obtaining component 210 may obtain or receive the temperature information from the temperature information generator 140. Specifically, the temperature information obtaining component 210 may transfer a temperature check command temp_check_CMD to the memory device 100 and receive the temperature information from the memory device 100. The temperature information obtaining component 210 may be referred to as a temperature information receiving component.

The write timing controller 220 may determine a write timing indicating a point of time at which write data stored in the write buffer 240 is transferred to and stored in the memory device 100. Specifically, the write timing controller 220 may adjust the write timing according to the temperature of the memory device 100 based on the temperature information. The write timing controller 220 may generate write timing information indicating the write timing. That is, the write timing controller 220 may generate the write timing information indicating a point of time at which the write data is transferred to and stored in the memory device 100.

The write operation controller 230 may control the write buffer 240 and the memory device 100 such that the write data stored in the write buffer 240 is transferred to and stored in the memory device 100 in response to the write timing information.

Figure 2:
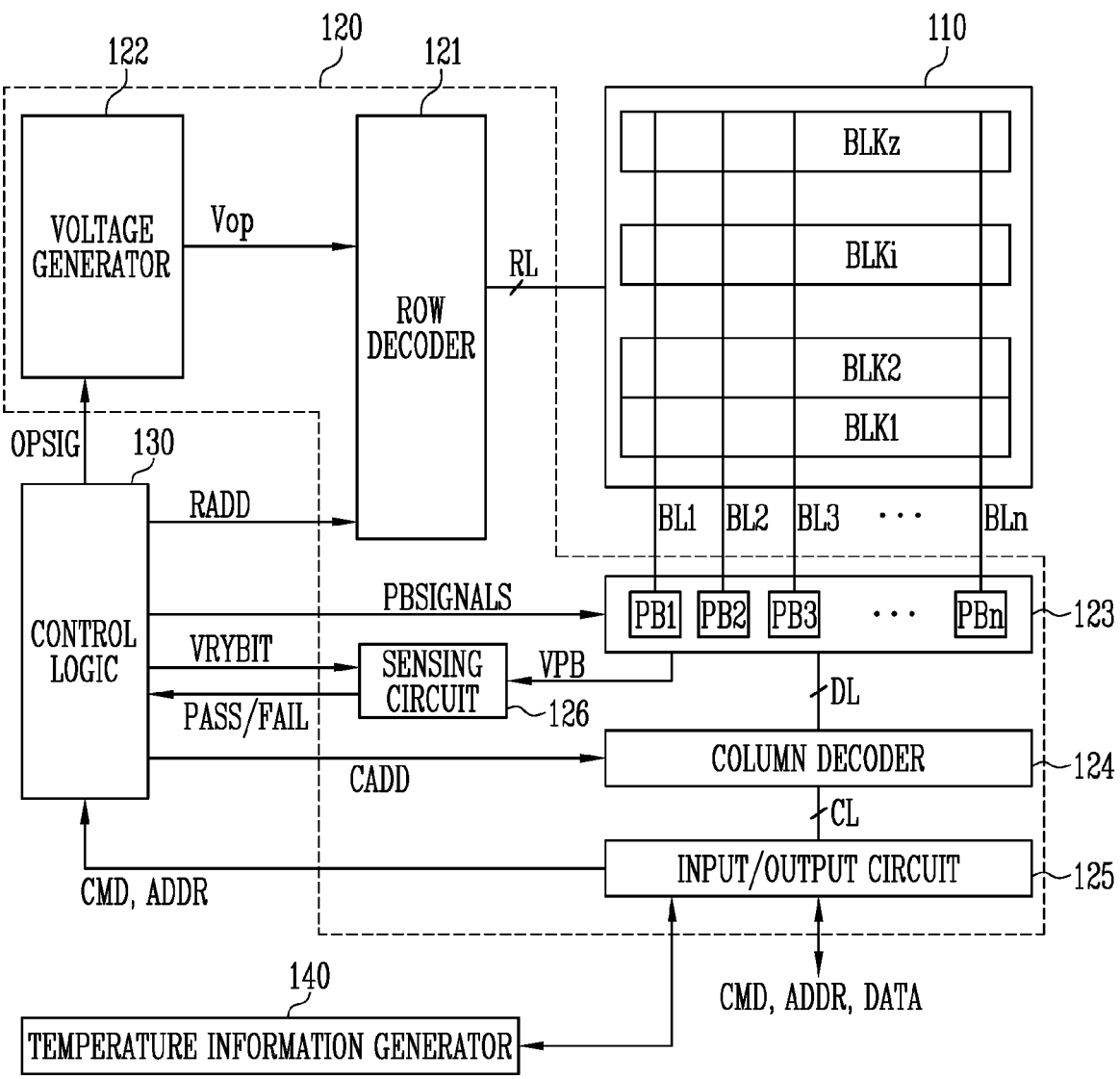
FIG. 2 illustrates a block diagram of a memory device of FIG. 1.

FIG. 2 illustrates a block diagram of the memory device 100 of FIG. 1.

Referring to FIG. 2, the memory device 100 may include a memory cell array 110, a peripheral circuit 120, and a control logic 130.

The memory cell array 110 includes a plurality of memory blocks BLK1 to BLKz. The plurality of memory blocks BLK1 to BLKz are connected to a row decoder 121 through row lines RL. The plurality of memory blocks BLK1 to BLKz are connected to a read and write circuit 123 through bit lines BL1 to BLn. Each of the plurality of memory blocks BLK1 to BLKz includes a plurality of memory cells. In an embodiment, the plurality of memory cells are non-volatile memory cells. Memory cells connected to the same word line among the plurality of memory cells are defined as one physical page. That is, each of the plurality of memory blocks BLK1 to BLKz is configured of a plurality of physical pages. Memory cells connected to the same bit line among the plurality of memory cells are defined as one string. That is, each of the plurality of memory blocks BLK1 to BLKz is configured of a plurality of strings.

According to an embodiment, each of the plurality of memory blocks BLK1 to BLKz included in the memory cell array 110 may further include a plurality of dummy cells. In each string of a memory block, at least one of the dummy cells may be connected in series between a drain select transistor and memory cells in the string and between a source select transistor and the memory cells.

The peripheral circuit 120 may include the row decoder 121, a voltage generator 122, the read and write circuit 123, a column decoder 124, an input/output circuit 125, and a sensing circuit 126.

The peripheral circuit 120 drives the memory cell array 110. For example, the peripheral circuit 120 may drive the memory cell array 110 to perform a program operation, a read operation, and an erase operation.

The row decoder 121 is connected to the memory cell array 110 through the row lines RL. The row lines RL may include drain select lines, word lines, source select lines, and a common source line. According to an embodiment of the present disclosure, the word lines may include normal word lines and dummy word lines. According to an embodiment of the present disclosure, the row lines RL may further include a pipe select line.

In an embodiment, the row lines RL may be local lines included in local line groups. The local line group may correspond to one memory block. The local line group may include a drain select line, local word lines, and a source select line.

The row decoder 121 is configured to operate under the control of the control logic 130. The row decoder 121 receives a row address RADD from the control logic 130.

The row decoder 121 is configured to decode a block address of the received row address RADD. The row decoder 121 selects at least one memory block among the memory blocks BLK1 to BLKz according to the decoded block address. The row decoder 121 is configured to decode the row address RADD of an address ADDR. The row decoder 121 may select at least one word line of the selected memory block by applying voltages supplied from the voltage generator 122 to the selected word line according to the decoded row address RADD.

During the program operation, the row decoder 121 may apply a program voltage to the selected word line and apply a pass voltage having a level less than that of the program voltage to unselected word lines. During a program verify operation, the row decoder 121 may apply a verify voltage to the selected word line and apply a verify pass voltage having a level greater than that of the verify voltage to the unselected word lines.

During the read operation, the row decoder 121 may apply a read voltage to the selected word line and apply a read pass voltage having a level greater than that of the read voltage to the unselected word lines.

According to an embodiment of the present disclosure, the erase operation of the memory device 100 is performed in memory block units. The address ADDR input to the memory device 100 during the erase operation includes a block address. The row decoder 121 may decode the block address and select one memory block according to the decoded block address. During the erase operation, the row decoder 121 may apply a ground voltage to word lines connected to the selected memory block.

According to an embodiment of the present disclosure, the column decoder 124 may be configured to decode a column address CADD of the address ADDR.

The voltage generator 122 is configured to generate a plurality of operation voltages Vop by using an external power voltage supplied to the memory device 100. The voltage generator 122 operates under the control of the control logic 130.

For example, the voltage generator 122 may generate an internal power voltage by regulating the external power voltage. The internal power voltage generated by the voltage generator 122 is used as an operation voltage of the memory device 100.

In an embodiment, the voltage generator 122 may generate the plurality of operation voltages Vop using the external power voltage or the internal power voltage. The voltage generator 122 may be configured to generate various voltages required by the memory device 100. For example, the voltage generator 122 may generate a plurality of erase voltages, a plurality of program voltages, a plurality of pass voltages, a plurality of verify voltages, a plurality of read voltages, and a plurality of read pass voltages, and so on.

In order to generate the plurality of operation voltages Vop having various voltage levels, the voltage generator 122 may include a plurality of pumping capacitors that receive the internal voltage and selectively activate the plurality of pumping capacitors to generate the plurality of operation voltages Vop.

The plurality of operation voltages Vop may be supplied to the memory cell array 110 by the row decoder 121.

The read and write circuit 123 includes first to n-th page buffers PB1 to PBn. The first to n-th page buffers PB1 to PBn are connected to the memory cell array 110 through first to n-th bit lines BL1 to BLn, respectively. The first to n-th page buffers PB1 to PBn operate under the control of the control logic 130.

The first to n-th page buffers PB1 to PBn communicate data DATA with the input/output circuit 125 via the column decoder 124. In the program operation, the first to n-th page buffers PB1 to PBn receive write data DATA from the input/output circuit 125 via the column decoder 124 and data lines DL.

During the program operation, when a program voltage is applied to the selected word line, the first to n-th page buffers PB1 to PBn may receive the write data DATA from the input/output circuit 125 and transfer the write data DATA to the selected memory cells through the bit lines BL1 to BLn. The memory cells of the selected page are programmed with the write data DATA. A memory cell connected to a bit line to which a program permission voltage (for example, a ground voltage) is applied may have an increased threshold voltage. A threshold voltage of a memory cell connected to a bit line to which a program inhibition voltage (for example, a power voltage) is applied may be maintained as it is without being increased. During the program verify operation, the first to n-th page buffers PB1 to PBn read the write data DATA stored in the memory cells from the selected memory cells through the bit lines BL1 to BLn.

During the read operation, the read and write circuit 123 may read data DATA stored in the memory cells of the selected page through the bit lines BL1 to BLn and store the read data DATA in the first to n-th page buffers PB1 to PBn.

During the erase operation, the read and write circuit 123 may float the bit lines BL1 to BLn. In an embodiment, the read and write circuit 123 may include a column selection circuit.

The column decoder 124 is connected to the first to n-th page buffers PB1 to PBn through the data lines DL. The column decoder 124 operates under the control of the control logic 130.

The input/output circuit 125 may include a plurality of input/output buffers (not shown) that receive input data DATA. During the program operation, the input/output circuit 125 receives the write data DATA from an external controller, e.g., the memory controller 200 shown in FIG. 1. During the read operation, the input/output circuit 125 outputs read data DATA transferred from the first to n-th page buffers PB1 to PBn included in the read and write circuit 123 to the external controller.

During the read operation or the verify operation, the sensing circuit 126 may generate a reference current in response to a signal of a permission bit VRYBIT generated by the control logic 130 and may compare a sensing voltage VPB received from the read and write circuit 123 with a reference voltage generated by the reference current to output a pass signal PASS or a fail signal FAIL to the control logic 130.

The control logic 130 may be connected to the row decoder 121, the voltage generator 122, the read and write circuit 123, the column decoder 124, the input/output circuit 125, and the sensing circuit 126. The control logic 130 may be configured to control all operations of the memory device 100. The control logic 130 may operate in response to a command CMD and the address ADDR transferred from an external device, e.g., the memory controller 200 shown in FIG. 1.

The control logic 130 may generate various signals in response to the command CMD and the address ADDR to control the peripheral circuit 120. For example, the control logic 130 may generate an operation signal OPSIG, the row address RADD, the column address CADD, a read and write circuit control signal PBSIGNALS, and the permission bit VRYBIT based on the command CMD and the address ADDR. The control logic 130 may output the operation signal OPSIG to the voltage generator 122, the row address RADD to the row decoder 121, the read and write circuit control signal PBSIGNALS to the read and write circuit 123, and the permission bit VRYBIT to the sensing circuit 126. In addition, the control logic 130 may determine whether the verify operation is passed or failed in response to the pass or fail signal PASS/FAIL output from the sensing circuit 126.

The memory device 100 according to an embodiment may further include the temperature information generator 140. The temperature information generator 140 may output the temperature information in response to the temperature check command temp_check_CMD received from the memory controller 200. Specifically, the temperature information generator 140 may measure the temperature of the memory device 100 and generate the temperature information corresponding to the measured temperature. The temperature information may be a temperature code expressing the measured temperature as a digital code. For example, the temperature information generator 140 may compare the temperature voltage Vtemp determined by the temperature of the memory device 100 with the preset reference voltage Vref, and may generate the temperature code according to the comparison result.

Figure 3:
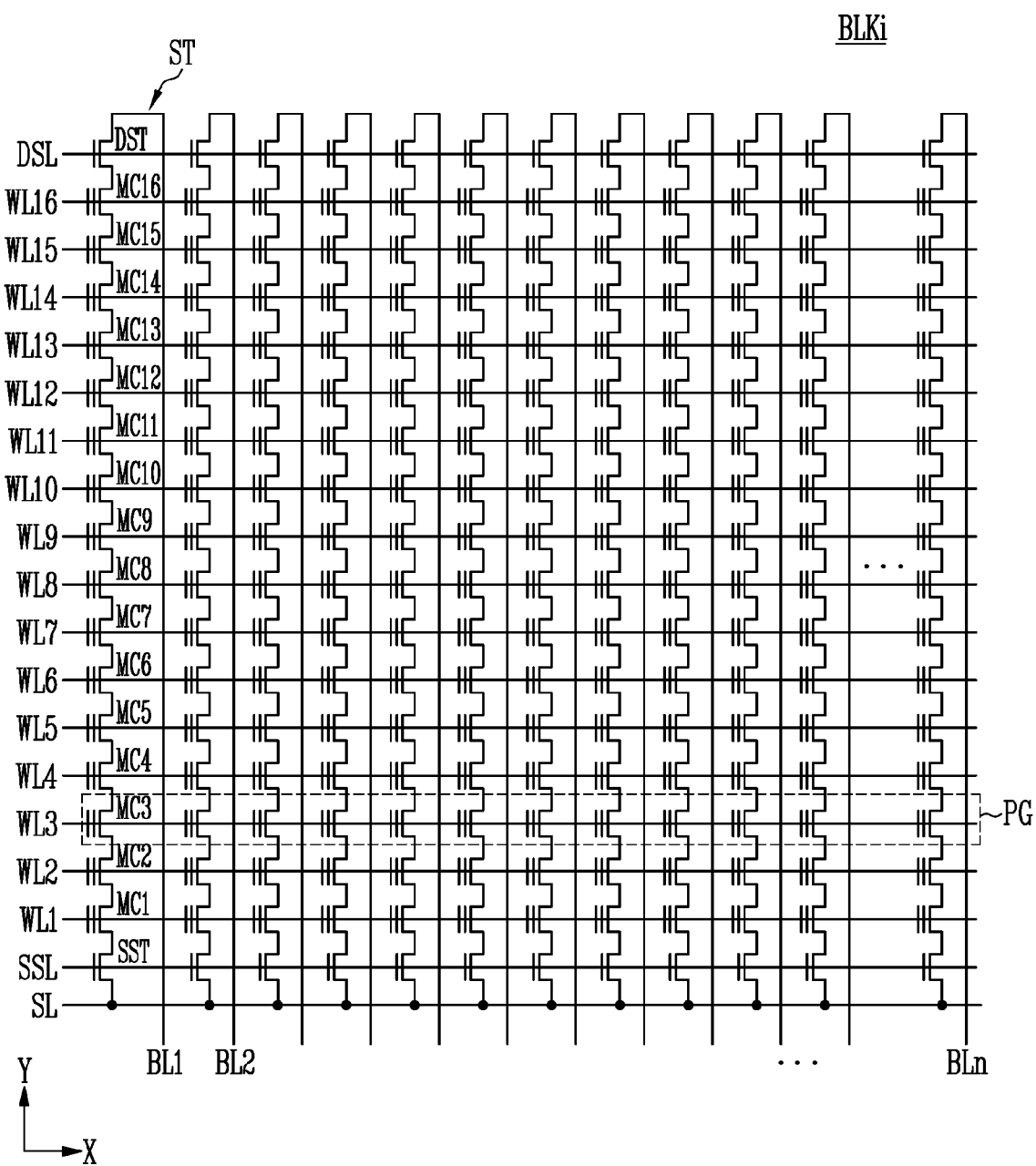
FIG. 3 illustrates a memory block of FIG. 2.

FIG. 3 illustrates a memory block BLKi of FIG. 2.

Referring to FIG. 3, a plurality of word lines arranged in parallel to each other between a first select line and a second select line may be connected to the memory block BLKi. Here, the first select line may be a source select line SSL, and the second select line may be a drain select line DSL. More specifically, the memory block BLKi may include a plurality of strings STs connected between the bit lines BL1 to BLn and a source line SL. The bit lines BL1 to BLn may be connected to the plurality of strings STs, respectively, and the source line SL may be commonly connected to the plurality of strings STs. Since the plurality of strings STs may be configured identically to each other, the first string connected to the first bit line BL1 will be specifically described as an example.

The first string may include a source select transistor SST, a plurality of memory cells MC1 to MC16, and a drain select transistor DST connected in series between the source line SL and the first bit line BL1. One string may include at least one source select transistor SST and at least one drain select transistor DST, and may include a plurality of memory cells whose number may be greater than the number of memory cells MC1 to MC16 shown in the drawing.

A source of the source select transistor SST may be connected to the source line SL, and a drain of the drain select transistor DST may be connected to the first bit line BL1. The memory cells MC1 to MC16 may be connected in series between a drain of the source select transistor SST and a source of the drain select transistor DST. Gates of the source select transistors SSTs included in the plurality of strings STs may be connected to the source select line SSL, gates of the drain select transistors DSTs included in the plurality of strings STs may be connected to the drain select line DSL, and gates of the memory cells MC1 to MC16 may be connected to a plurality of word lines WL1 to WL16. A group of memory cells connected to the same word line among a plurality of memory cells included in the plurality of strings STs may be referred to as a physical page PG. Therefore, the memory block BLKi may include as many physical pages PGs as the number of word lines WL1 to WL16.

One memory cell may store 1-bit data. This is commonly called a single level cell (SLC). In this case, one physical page PG may store one logical page (LPG) data. The one LPG data may include as many data bits as the number of cells included in one physical page PG. In another embodiment, one memory cell may store two or more bits of data. In this case, one physical page PG may store two or more LPG data.

Figure 4:
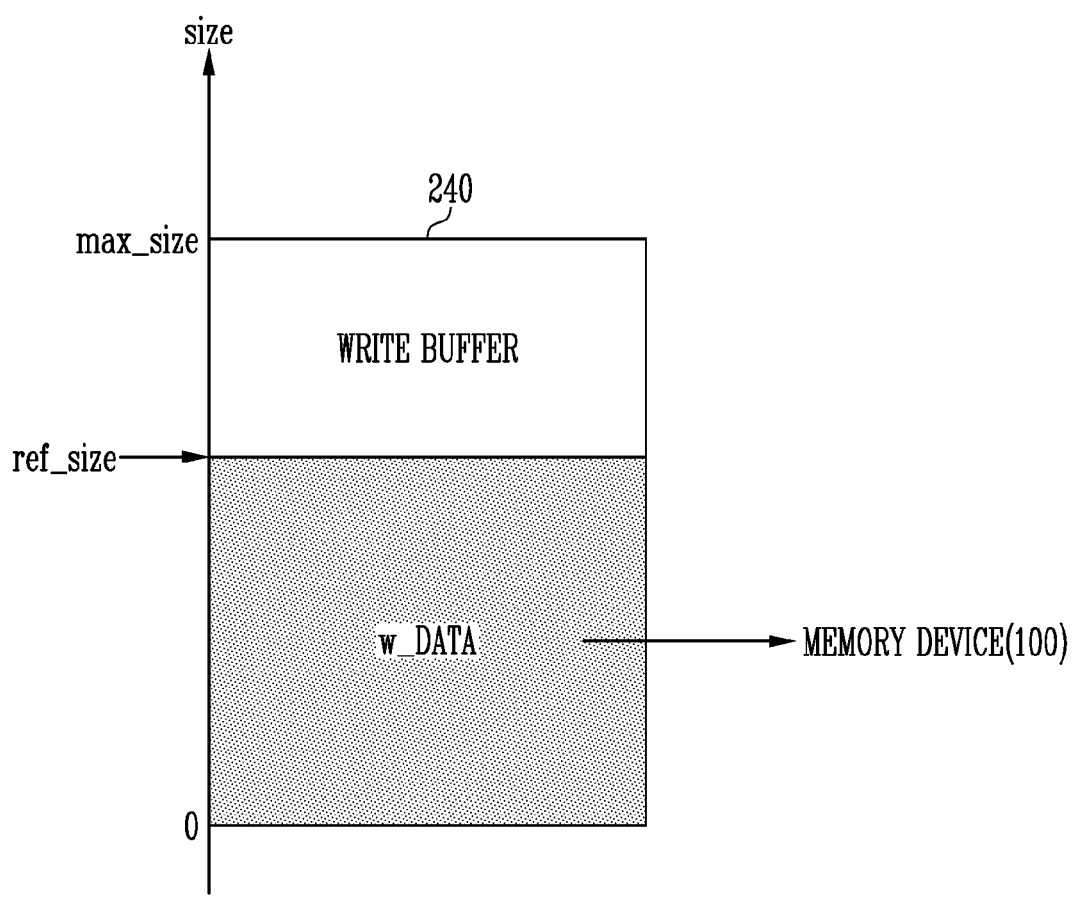
FIG. 4 illustrates a method of determining a write timing using a reference size according to an embodiment.

FIG. 4 illustrates a method of determining a write timing using a reference size according to an embodiment. The method illustrated in FIG. 4 will be described with reference to FIG. 1.

Referring to FIG. 4, the write buffer 240 can store write data of a maximum size max_size. However, when a size of write data w_DATA stored in the write buffer 240 exceeds a reference size ref_size, the memory controller 200 may control the write buffer 240 and the memory device 100 such that the write data w_DATA stored in the write buffer 240 is transferred to and stored in the memory device 100. The reference size ref_size may be equal to or greater than 0, and may be equal to or less than the maximum size max_size (i.e., 0≤ref_size≤max_size).

In other words, the memory controller 200 may compare the size of the write data w_DATA stored in the write buffer 240 with the reference size ref_size, and when the size of the write data w_DATA is greater than the reference size ref_size, the memory controller 200 may control the write buffer 240 and the memory device 100 such that the write data w_DATA is transferred to and stored in the memory device 100.

Figure 5:
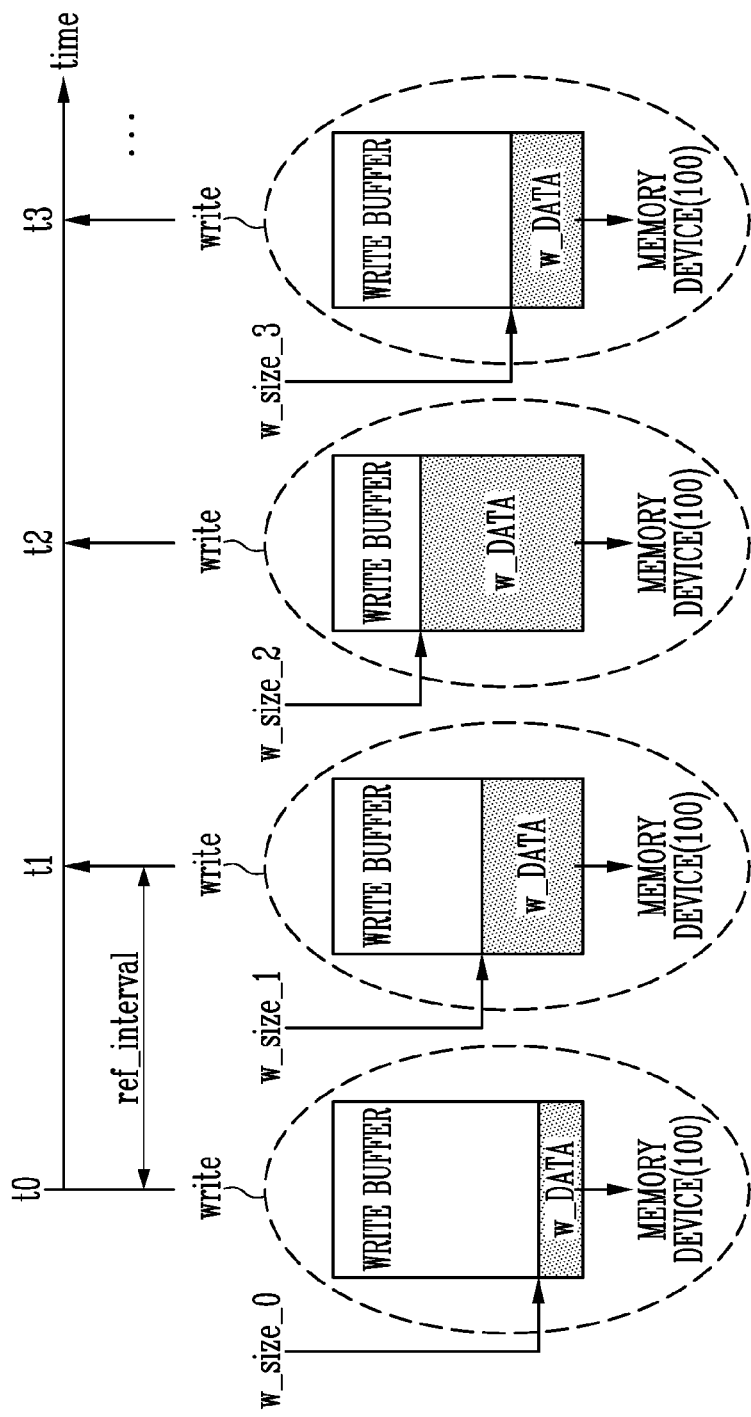
FIG. 5 illustrates a method of determining a write timing using a reference time interval according to an embodiment.

FIG. 5 illustrates a method of determining a write timing using a reference time interval according to an embodiment. The method illustrated in FIG. 5 will be described with reference to FIG. 1.

Referring to FIG. 5, the memory controller 200 may control the write buffer 240 and the memory device 100 such that write data w_DATA temporarily stored in the write buffer 240 is transferred to and stored in the memory device 100 at a reference time interval ref_interval.

For example, the memory controller 200 may control the write buffer 240 and the memory device 100 such that the write data w_DATA temporarily stored in the write buffer 240 is transferred to and stored in the memory device 100 at a 0-th time t0. At this time, the size of the write data w_DATA may be a 0-th size w_size_0.

The memory controller 200 may control the write buffer 240 and the memory device 100 such that the write data w_DATA temporarily stored in the write buffer 240 is transferred to and stored in the memory device 100 at a first time t1 after a time period corresponding to the reference time interval ref_interval elapses from the 0-th time t0. At this time, the size of the write data w_DATA may be a first size w_size_1.

The memory controller 200 may control the write buffer 240 and the memory device 100 such that the write data w_DATA temporarily stored in the write buffer 240 is transferred to and stored in the memory device 100 at a second time t2 after the time period corresponding to the reference time interval ref_interval elapses from the first time t1. At this time, the size of the write data w_DATA may be a second size w_size_2.

The memory controller 200 may control the write buffer 240 and the memory device 100 such that the write data w_DATA temporarily stored in the write buffer 240 is transferred to and stored in the memory device 100 at a third time t3 after the time period corresponding to the reference time interval ref_interval elapses from the second time t2. At this time, the size of the write data w_DATA may be a third size w_size_3. The 0-th size w_size_0 to the third size w_size_3 may be equal to or different from each other.

In other words, the memory controller 200 may control the write buffer 240 and the memory device 100 such that the write data w_DATA temporarily stored in the write buffer 240 is stored in the memory device 100 regardless of the size of the write data w_DATA temporarily stored in the write buffer 240, which is different from the method shown in FIG. 4.

Figure 6:
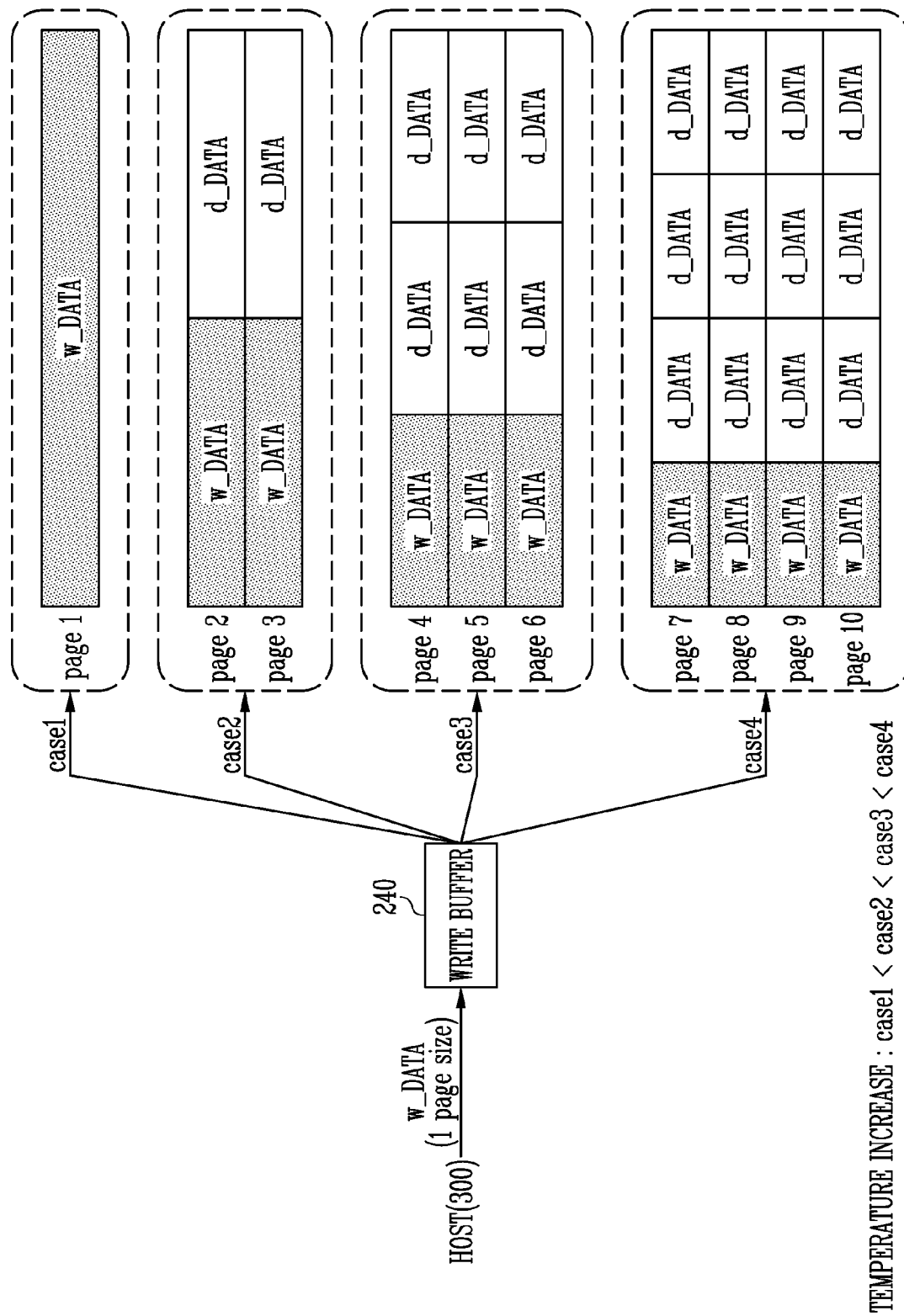
FIG. 6 illustrates a relationship between a write operation and a temperature increase of a memory device according to an embodiment.

FIG. 6 illustrates a relationship between a write operation and a temperature increase of a memory device according to an embodiment. The relationship illustrated in FIG. 6 will be described with reference to FIGS. 1 and 2.

Referring to FIG. 6, the memory controller 200 may temporarily store write data w_DATA received from the host 300 in the write buffer 240. For example, the size of the write data w_DATA may be the same as a size of a page included in the memory cell array 110. The size of the page may be the same as a size of a physical page (PG) or a logical page (LG).

The write data w_DATA may be stored in one page included in the memory cell array 110 of FIG. 2 or may be divided into a plurality of divisions, and the plurality of divisions may be stored in a plurality of pages, respectively.

For example, referring to FIG. 6, in a first case case 1, the write data w_DATA may be stored in a first page page 1. In a second case case 2, the write data w_DATA may be divided into two divisions and stored in a second page page 2 and a third page page 3. In a third case case 3, the write data w_DATA may be divided into three divisions and stored in a fourth page page 4, a fifth page page 5, and a sixth page page 6. In a fourth case case 4, the write data w_DATA may be divided into four divisions and stored in a seventh page page 7, an eighth page page 8, a ninth page page 9, and a tenth page page 10.

Since data is stored in the memory device 100 in a page unit, in the second case case 2 to the fourth case case 4, in addition to the divided write data w_DATA, dummy data d_DATA may be stored together with the divided write data w_DATA in each page. While storing data in the page, a temperature of the memory device 100 may increase. Specifically, in order to store the data in the page, since the peripheral circuit 120 applies the plurality of operation voltages Vop to the word lines and the bit lines and the control logic 130 generates the control signals to control the peripheral circuits 120, an overall temperature of the memory device 100 may increase.

In the first case case 1 to the fourth case case 4, the write data w_DATA of the same size is stored in the memory device 100. However, in the fourth case case 4, the write data w_DATA may be stored in four pages; in the third case case 3, the write data w_DATA may be stored in three pages; in the second case case 2, the write data w_DATA may be stored in two pages; and in the first case case 1, the write data w_DATA may be stored in one page. Therefore, the temperature of the memory device 100 may increase in an order of the first case case 1, the second case case 2, the third case case 3, and the fourth case case 4 since the higher heat is generated in the memory device 100 as the number of pages activated increases.

The memory controller 200 according to an embodiment may manage the temperature of the memory device 100 by adjusting the write timing of the write data w_DATA according to the temperature of the memory device 100. For example, when the temperature of the memory device 100 is low, the memory controller 200 may increase the number of pages in which the write data w_DATA is stored by reducing the reference size ref_size. Alternatively, when the temperature of the memory device 100 is low, the memory controller 200 may increase the number of pages in which the write data w_DATA is stored by reducing the reference time interval ref_interval. On the other hand, when the temperature of the memory device 100 is high, the memory controller 200 may decrease the number of pages in which the write data w_DATA is stored by increasing the reference size ref_size or the reference time interval ref_interval.

Figure 7:
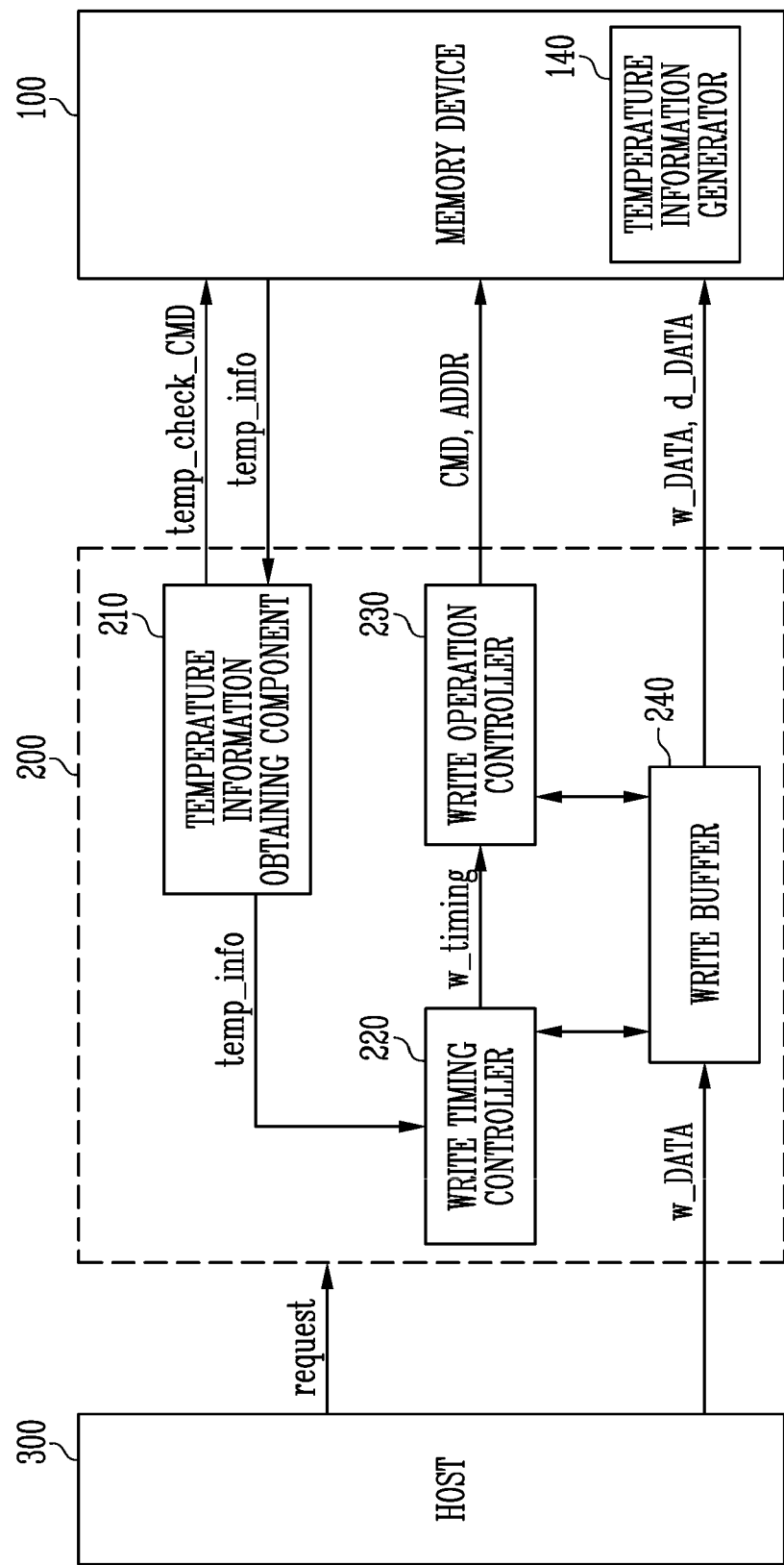
FIG. 7 illustrates a block diagram of a memory controller according to an embodiment.

FIG. 7 illustrates a block diagram of the memory controller 200 of FIG. 1 according to an embodiment.

Referring to FIG. 7, the host 300 may transfer write data w_DATA and a write request to the memory controller 200. The memory controller 200 may determine a write timing according to a temperature of the memory device 100, and may generate control signals to control the write buffer 240 and the memory device 100 such that the write data w_DATA temporally stored in the write buffer 240 is transferred to and stored in the memory device 100 at the write timing.

The memory controller 200 may include the temperature information obtaining component 210, the write timing controller 220, the write operation controller 230, and the write buffer 240, as described above with reference to FIG. 1.

The temperature information obtaining component 210 may receive the temperature information from the temperature information generator 140. Specifically, the temperature information obtaining component 210 may transfer the temperature check command temp_check_CMD to the memory device 100 and obtain the temperature information temp_info from the memory device 100. The temperature information temp_info may be a temperature code expressing the temperature of the memory device 100 as a digital code.

The write timing controller 220 may determine the write timing at which the write data w_DATA temporarily stored in the write buffer 240 is transferred to and stored in the memory device 100. Specifically, the write timing controller 220 may adjust the write timing according to the temperature of the memory device 100. The write timing controller 220 may receive the temperature information temp_info from the temperature information obtaining component 210 and may generate the write timing information w_timing indicating the write timing. That is, the write timing controller 220 may generate information indicating a point of time at which the write data w_DATA is stored in the memory device 100 based on the temperature information temp_info.

In an embodiment, when the size of the write data w_DATA temporarily stored in the write buffer 240 is greater than the reference size ref_size, the write timing controller 220 may determine the write timing such that the write data w_DATA stored in the write buffer 240 is transferred to and stored in the memory device 100.

The write timing controller 220 may change the reference size ref_size according to the temperature of the memory device 100. For example, when the temperature of the memory device 100 is low, the write timing controller 220 may reduce the reference size ref_size and thus generate write timing information more frequently. Accordingly, compared to a case of using a longer reference size, write data of the same size is stored in an increased number of pages in the memory device 100 since when a write operation is performed at each write timing, write data w_DATA stored in the write buffer 240 is stored in a fixed number of pages, e.g., in one page, in the memory device 100.

In another embodiment, the write timing controller 220 may determine the write timing such that the write data w_DATA stored in the write buffer 240 is transferred to and stored in the memory device 100 at the reference time interval ref_interval. The write timing controller 220 may change the reference time interval ref_interval according to the temperature of the memory device 100. For example, when the temperature of the memory device 100 is low, the write timing controller 220 may reduce the reference time interval ref_interval such that the write data w_DATA temporarily stored in the write buffer 240 is stored in the memory device 100 more often based on the shortened reference time interval ref_interval. Accordingly, compared to a case of using a longer reference time interval, write data of the same size is stored in an increased number of pages in the memory device 100 since when a write operation is performed at each write timing, write data w_DATA stored in the write buffer 240 is stored in a fixed number of pages, e.g., in one page, in the memory device 100.

The write operation controller 230 may control the write buffer 240 and the memory device 100 such that the write data w_DATA or the dummy data d_DATA stored in the write buffer 240 is stored in the memory device 100 in response to the write timing information w_timing. When the size of the write data w_DATA stored in the write buffer 240 is less than a size of the page at a point of time corresponding to the write timing information w_timing, the write operation controller 230 may store the dummy data d_DATA in the write buffer 240, and control the write buffer 240 and the memory device 100 such that the write data w_DATA and the dummy data d_DATA are stored in the memory device 100. The write operation controller 230 may transfer a program command CMD and a physical address ADDR to the memory device 100. The physical address ADDR may be an address indicating a page in which the write data w_DATA and the dummy data d_DATA are to be stored.

Figure 8:
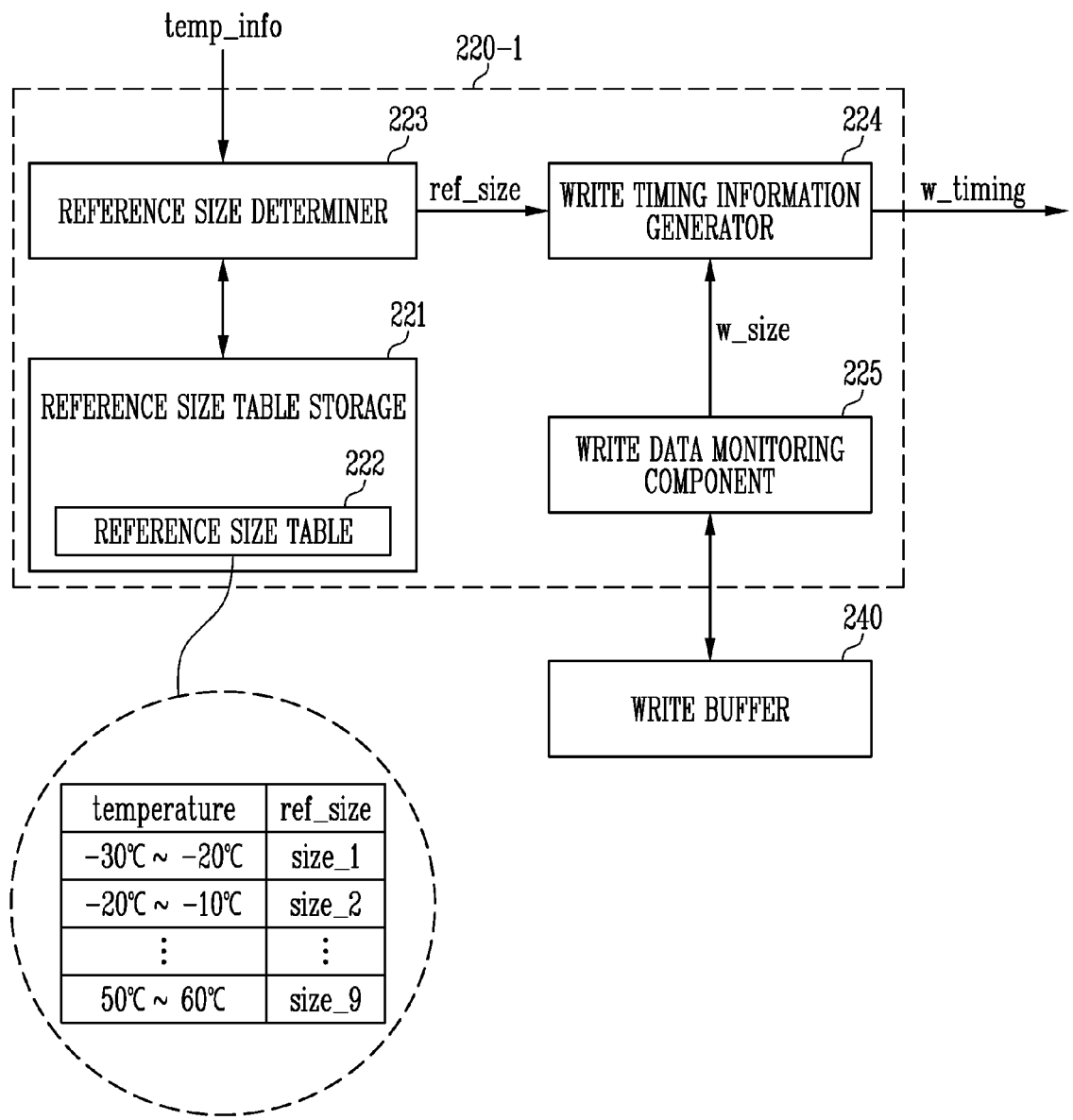
FIG. 8 illustrates a block diagram of a write timing controller according to an embodiment.

FIG. 8 illustrates a block diagram of a write timing controller 220-1 according to an embodiment. The write timing controller 220-1 may correspond to the write timing controller 220 of FIGS. 1 and 7.

Referring to FIG. 8, the write timing controller 220-1 may include a reference size table storage 221, a reference size determiner 223, a write timing information generator 224, and a write data monitoring component 225. The reference size table storage 221 may include a reference size table 222.

The reference size determiner 223 may receive the temperature information temp_info from the temperature information obtaining component 210 and determine a reference size ref_size according to the temperature of the memory device 100.

Specifically, the reference size determiner 223 may determine the target reference size ref_size with reference to the reference size table 222 stored in the reference size table storage 221. The reference size table 222 may include information indicating a relationship between the temperature of the memory device 100 and a reference size ref_size.

For example, when the temperature of the memory device 100 is equal to or greater than −30° C. and less than −20° C., the target reference size ref_size may be a first reference size size_1. When the temperature of the memory device 100 is equal to or greater than −20° C. and less than −10° C., the target reference size ref_size may be a second reference size size_2. When the temperature of the memory device 100 is equal to or greater than 50° C. and less than 60° C., the target reference size ref_size may be a ninth reference size size_9. The reference size table 222 is not limited thereto.

The write data monitoring component 225 may monitor the size w_size of the write data w_DATA stored in the write buffer 240.

The write timing information generator 224 may receive the size w_size of the write data w_DATA from the write data monitoring component 225, compare the size w_size of the write data w_DATA with the target reference size ref_size, and generate the write timing information w_timing according to the comparison result. Specifically, when the size w_size of the write data w_DATA is equal to or greater than the target reference size ref_size, the write timing information generator 224 may generate the write timing information w_timing. Here, the write timing information w_timing may indicate a point of time at which the write data w_DATA temporarily stored in the write buffer 240 is transferred to and stored in the memory device 100.

The write timing controller 220-1 may reduce the target reference size ref_size such that the write timing information w_timing is more frequently generated as the temperature of the memory device 100 becomes lower.

Figure 9:
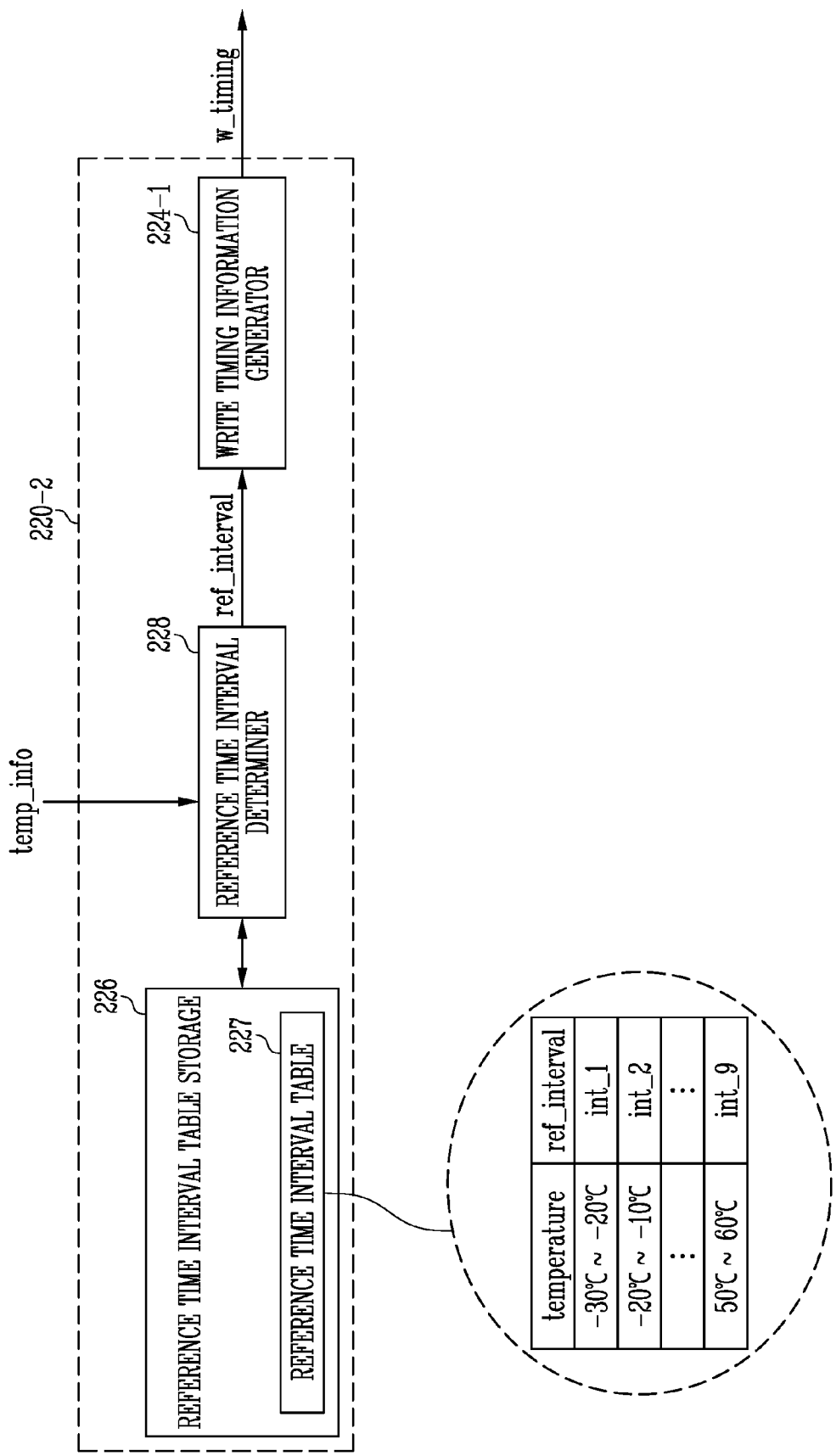
FIG. 9 illustrates a block diagram of a write timing controller according to another embodiment.

FIG. 9 illustrates a block diagram of a write timing controller 220-2 according to another embodiment. The write timing controller 220-2 may correspond to the write timing controller 220 of FIGS. 1 and 7.

Referring to FIG. 9, the write timing controller 220-2 may include a reference time interval table storage 226, a reference time interval determiner 228, and a write timing information generator 224. The reference time interval table storage 226 may store a reference time interval table 227.

The reference time interval determiner 228 may receive the temperature information temp_info from the temperature information obtaining component 210 and determine a reference time interval ref_interval according to the temperature of the memory device 100.

Specifically, the reference time interval determiner 228 may determine a target reference time interval ref_interval with reference to the reference time interval table 227 stored in the reference time interval table storage 226. The reference time interval table 227 may include information indicating a relationship between the temperature of the memory device 100 and a reference time interval ref_interval.

For example, when the temperature of the memory device 100 is equal to or greater than −30° C. and less than −20° C., the target reference time interval ref_interval may be a first reference time interval int_1. When the temperature of the memory device 100 is equal to or greater than −20° C. and less than −10° C., the target reference time interval ref_interval may be a second reference time interval int_2. When the temperature of the memory device 100 is equal to or greater than 50° C. and less than 60° C., the target reference time interval ref_interval may be a ninth reference time interval int_9. The reference time interval table 227 according to an embodiment is not limited thereto.

The write timing information generator 224 may generate the write timing information w_timing according to the target reference time interval ref_interval received from the reference time interval determiner 228.

In an embodiment, when the write timing information generator 224 receives the first reference time interval int_1 from the reference time interval determiner 228, the write timing information generator 224 may generate the write timing information w_timing indicating that write data stored in the write buffer 240 is to be stored in the memory device 100 at a time interval of 1 ms. When the second reference time interval int_2 is received, the write timing information generator 224 may generate the write timing information w_timing indicating that the write data is to be stored in the memory device 100 at a time interval of 2 ms, and when the ninth reference time interval int_9 is received, the write timing information generator 224 may generate the write timing information w_timing indicating that the write data is to be stored in the memory device 100 at a time interval of 9 ms. That is, as the temperature of the memory device 100 increases, the target reference time interval ref_interval may increase. As the temperature of the memory device 100 decreases, the target reference time interval ref_interval may decrease.

In another embodiment, the write timing information w_timing according to the first reference time interval int_1 to the ninth reference time interval int_9 may be variously set.

The write timing controller 220-2 may reduce the target reference time interval ref_interval such that the write timing information w_timing is more frequently generated as the temperature of the memory device 100 becomes lower.

Figure 10:
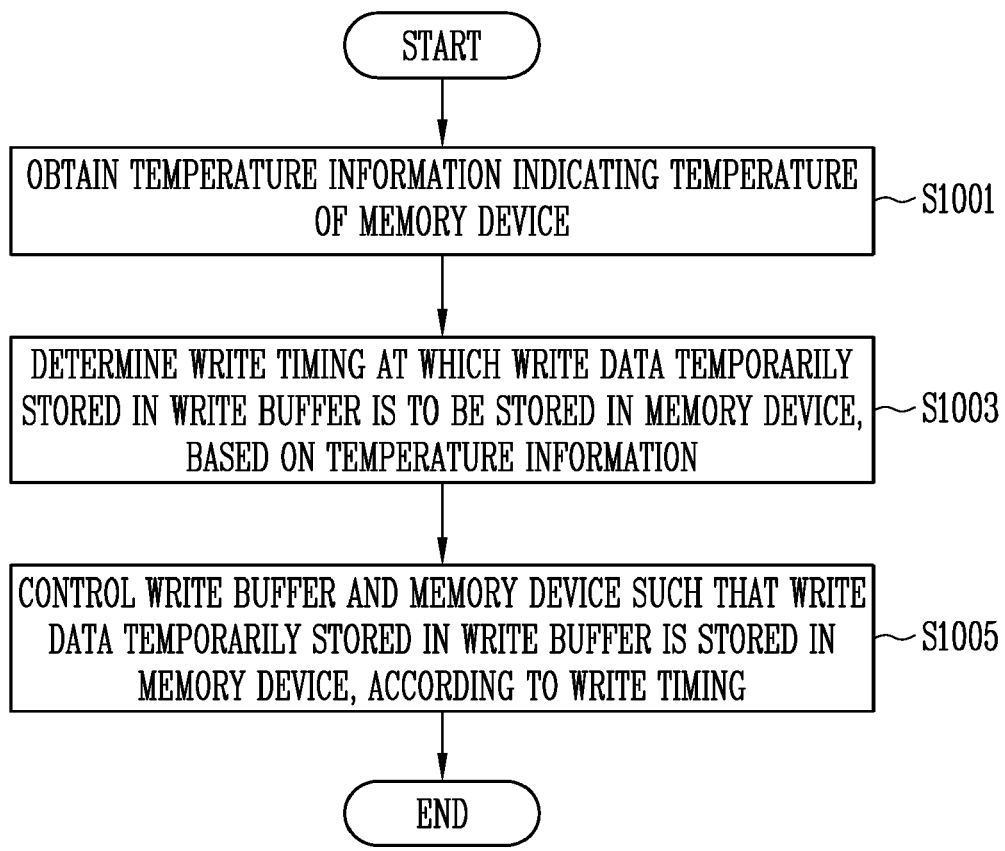
FIG. 10 is a flowchart for describing a method of operating a memory controller according to an embodiment.

FIG. 10 is a flowchart for describing a method of operating the memory controller 200 of FIG. 1 according to an embodiment.

Referring to FIG. 10, in step S1001, the temperature information obtaining component 210 of the memory controller 200 may obtain or receive the temperature information temp_info indicating the temperature of the memory device 100. In an embodiment, specifically, the temperature information obtaining component 210 may transfer the temperature check command temp_check_CMD to the memory device 100 and obtain the temperature information temp_info from the temperature information generator 140. The temperature information temp_info may be a temperature code expressing the temperature of the memory device 100 as a digital code.

In step S1003, the write timing controller 220 of the memory controller 200 may determine the write timing at which write data temporarily stored in the write buffer 240 is to be stored in the memory device 100 based on the temperature information temp_info. Whenever the write data is stored in the memory device 100, heat is generated in the memory device 100 and thus the temperature of the memory device 100 may increase. Therefore, the memory controller 200 may control the temperature of the memory device 100 by determining the write timing according to the temperature of the memory device 100.

In step S1005, the write operation controller 230 of the memory controller 200 may control the write buffer 240 and the memory device 100 such that the write data temporarily stored in the write buffer 240 is stored in the memory device 100 according to the determined write timing.

The memory controller 200 may control the temperature of the memory device 100 by adjusting the write timing according to the temperature of the memory device 100.

Figure 11:
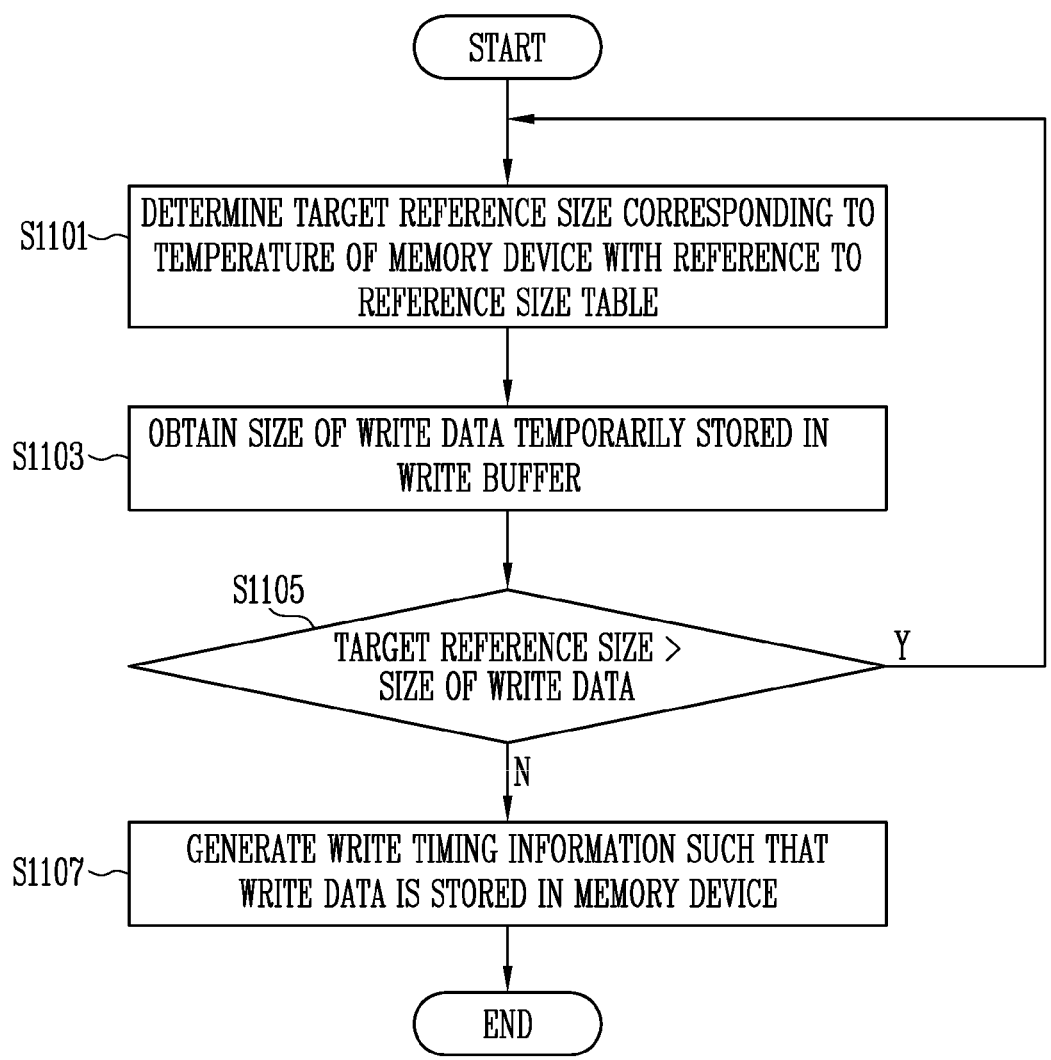
FIG. 11 is a flowchart for describing the method of determining the write timing based on the reference size.

FIG. 11 is a flowchart for describing the method of determining the write timing based on the reference size, which has been described above with reference to FIGS. 4 and 8. The method of FIG. 11 will be described with reference to FIG. 8.

Referring to FIGS. 8 and 11, in step S1101, the reference size determiner 223 may determine a target reference size ref_size corresponding to the temperature of the memory device 100 with reference to the reference size table 222. The reference size table 222 may include information indicating the relationship between the temperature of the memory device 100 and the target reference size ref_size. Referring to the reference size table 222 shown in FIG. 8, when the temperature of the memory device 100 is equal to or greater than −30° C. and less than −20° C., the target reference size ref_size may be the first reference size size_1. When the temperature of the memory device 100 is equal to or greater than −20° C. and less than −10° C., the target reference size ref_size may be the second reference size size_2. When the temperature of the memory device 100 is equal to or greater than 50° C. and less than 60° C., the target reference size ref_size may be the ninth reference size size_9. The reference size table 222 according to an embodiment is not limited thereto.

In step S1103, the write data monitoring component 225 may obtain the size w_size of write data temporarily stored in the write buffer 240.

In step S1105, the write timing information generator 224 may compare the target reference size ref_size with the size w_size of the write data temporarily stored in the write buffer 240. When the target reference size ref_size is greater than the size w_size of the write data, the process goes back to step S1101. When the target reference size ref_size is not greater than the size w_size of the write data, i.e., when the size w_size of the write data is equal to or greater than the target reference size ref_size, the memory controller 200 may perform step S1107.

In step S1107, the write timing information generator 224 may generate write timing information w_timing, such that the write data is transferred to and stored in the memory device 100.

The memory controller 200 may control the temperature of the memory device 100 by adjusting the target reference size according to the temperature of the memory device 100.

Figure 12:
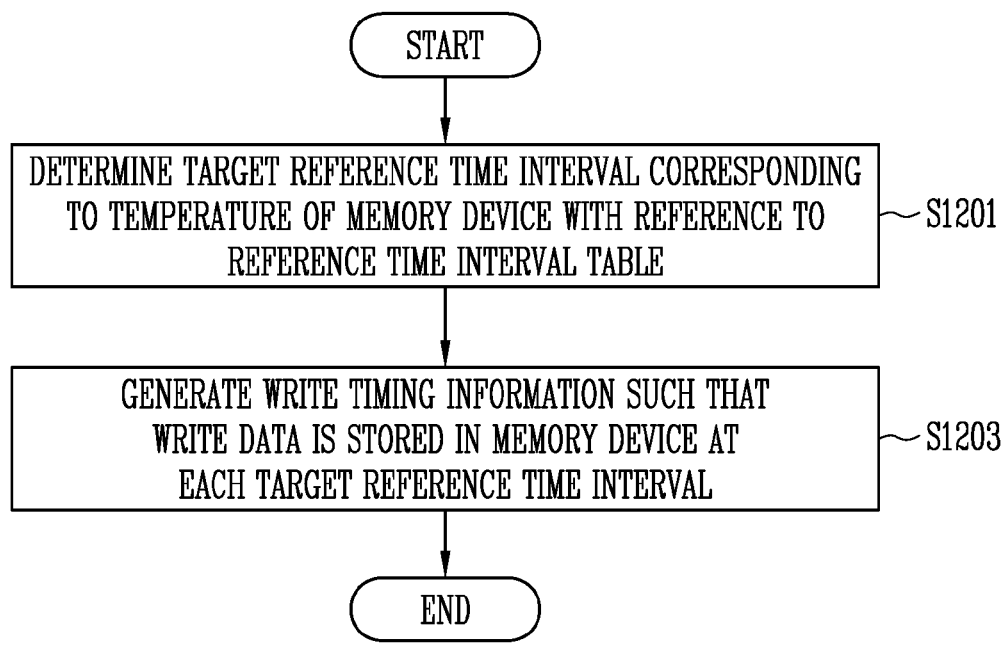
FIG. 12 is a flowchart for describing the method of determining the write timing based on the reference time interval.

FIG. 12 is a flowchart for describing the method of determining the write timing based on the reference time interval, which has been described above with reference to FIGS. 5 and 9. The method of FIG. 12 will be described with reference to FIG. 9.

Referring to FIGS. 9 and 12, in step S1201, a reference time interval determiner 228 may determine a target reference time interval ref_interval corresponding to the temperature of the memory device 100 with reference to the reference time interval table 227. The target reference time interval ref_interval may be a time interval at which the write timing information is generated, and may be also referred to as a target time interval. The reference time interval table 227 may include information indicating the relationship between the temperature of the memory device 100 and the target reference time interval ref_interval.

Referring to the reference time interval table 227 shown in FIG. 9, when the temperature of the memory device 100 is equal to or greater than −30° C. and less than −20° C., the target time interval ref_interval may be the first reference time interval int_1. When the temperature of the memory device 100 is equal to or greater than −20° C. and less than −10° C., the target time interval ref_interval may be the second reference time interval int_2. When the temperature of the memory device 100 is equal to or greater than 50° C. and less than 60° C., the target time interval ref_interval may be the ninth reference time interval int_9. The reference time interval table 227 according to an embodiment is not limited thereto.

In step S1203, the write timing information generator 224 may generate write timing information w_timing at the target time interval ref_interval, such that write data temporarily stored in the write buffer 240 is stored in the memory device 100 at the target time interval ref_interval.

Referring further to FIG. 5, the memory controller 200 may control the write buffer 240 and the memory device 100 such that the write data w_DATA is stored in the memory device 100 at the 0-th time t0. At this time, the size of the write data w_DATA may be the 0-th size w_size_0. After that, the memory controller 200 may control the write buffer 240 and the memory device 100 such that the write data w_DATA is stored in the memory device 100 at the first time t1 after the target reference time interval ref_interval elapses from the 0-th time t0. At this time, the size of the write data w_DATA may be the first size w_size_1. After that, the memory controller 200 may control the write buffer 240 and the memory device 100 such that the write data w_DATA is stored in the memory device 100 at the second time t2 after the target reference time interval ref_interval elapses from the first time t1. At this time, the size of the write data w_DATA may be the second size w_size_2. After that, the memory controller 200 may control the write buffer 240 and the memory device 100 such that the write data w_DATA is stored in the memory device 100 at the third time t3 after the target reference time interval ref_interval elapses from the second time t2. At this time, the size of the write data w_DATA may be the third size w_size_3. The 0-th size w_size_0 to the third size w_size_3 may be equal to or different from each other.

The memory controller 200 may control the temperature of the memory device 100 by adjusting the target time interval ref_interval according to the temperature of the memory device 100.

Figure 13:
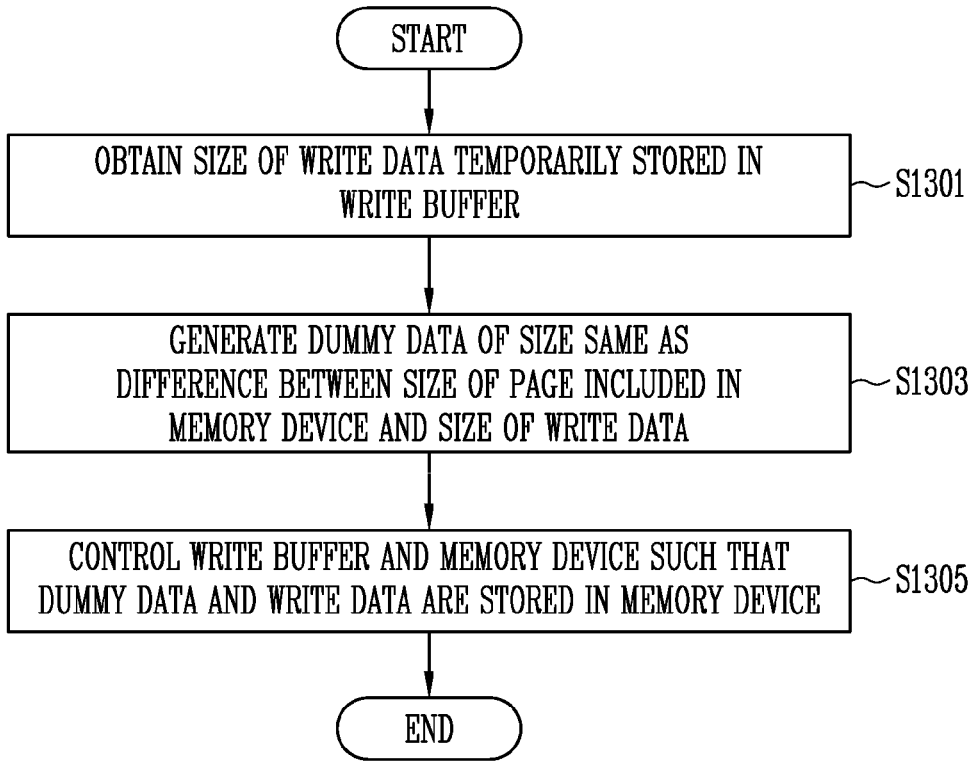
FIG. 13 is a flowchart for describing a method for storing dummy data together with write data in a memory device according to an embodiment.

FIG. 13 is a flowchart for describing a method for storing dummy data together with write data in the memory device 100 of FIG. 1 according to an embodiment.

Referring to FIGS. 1 and 13, in step S1301, the write operation controller 230 of the memory controller 200 may obtain the size of the write data temporarily stored in the write buffer 240 when the write timing information is generated.

In step S1303, the write operation controller 230 may generate the dummy data corresponding to a difference between a size of a page included in the memory device 100 and the size of the write data. The write operation controller 230 may control the write buffer 240 such that the generated dummy data is temporarily stored in the write buffer 240. Therefore, the write data and the dummy data may be temporarily stored in the write buffer 240. A sum of the size of the write data and the size of the dummy data may be the same as the size of the page.

In step S1305, the write operation controller 230 may control the write buffer 240 and the memory device 100 such that the dummy data and the write data temporarily stored in the write buffer 240 are transferred to and stored in the memory device 100. The memory device 100 may program data in a page unit. Therefore, the write data and the dummy data stored in the write buffer 240 may be stored in one page of the memory device 100.

Figure 14:
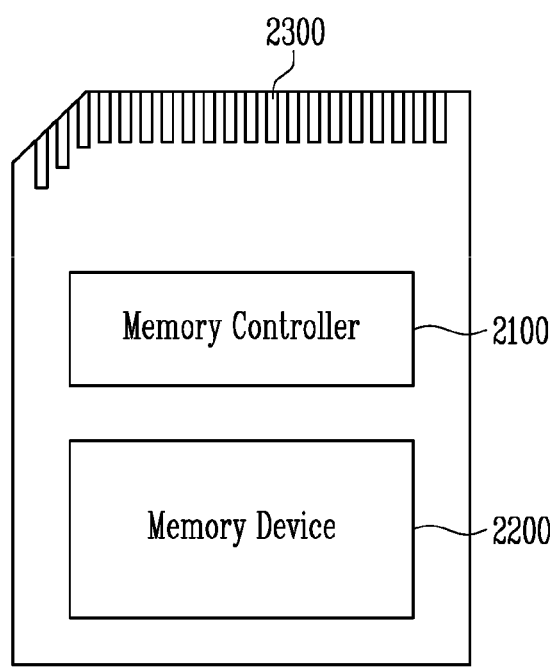
FIG. 14 is a block diagram illustrating a memory card system to which the storage device according to an embodiment of the present disclosure is applied.

FIG. 14 is a block diagram illustrating a memory card system 2000 to which the storage device according to an embodiment of the present disclosure is applied.

Referring to FIG. 14, the memory card system 2000 includes a memory controller 2100, a memory device 2200, and a connector 2300. The memory controller 2100 and the memory device 2200 may respectively correspond to the memory controller 200 and the memory device 100 shown in FIG. 1.

The memory controller 2100 is connected to the memory device 2200. The memory controller 2100 is configured to access the memory device 2200. For example, the memory controller 2100 is configured to control read, write, erase, and background operations of the memory device 2200. The memory controller 2100 is configured to provide an interface between the memory device 2200 and a host. The memory controller 2100 is configured to drive firmware for controlling the memory device 2200. The memory device 2200 may be implemented identically to the memory device 100 described with reference to FIG. 2.

For example, the memory controller 2100 may include components such as a random access memory (RAM), a processor, a host interface, a memory interface, and an error corrector.

The memory controller 2100 may communicate with an external device, e.g., the host, through the connector 2300. The memory controller 2100 may communicate with the external device according to a specific communication standard. For example, the memory controller 2100 is configured to communicate with the external device through at least one of various communication standards such as a universal serial bus (USB), a multimedia card (MMC), an embedded MMC (eMMC), a peripheral component interconnection (PCI), a PCI express (PCI-E), an advanced technology attachment (ATA), a serial-ATA, a parallel-ATA, a small computer system interface (SCSI), an enhanced small disk interface (ESDI), integrated drive electronics (IDE), FireWire, a universal flash storage (UFS), Wi-Fi, Bluetooth, an NVMe, and so on. For example, the connector 2300 may be defined by at least one of the various communication standards described above.

For example, the memory device 2200 may be implemented with at least one of various non-volatile memory devices such as an electrically erasable and programmable ROM (EEPROM), a NAND flash memory, a NOR flash memory, a phase-change RAM (PRAM), a resistive RAM (ReRAM), a ferroelectric RAM (FRAM), a spin-torque magnetic RAM (STT-MRAM), and so on.

The memory controller 2100 and the memory device 2200 may be integrated into one semiconductor device to configure a memory card such as a PC card (personal computer memory card international association (PCMCIA)), a compact flash card (CF), a smart media card (SM or SMC), a memory stick, a multimedia card (MMC, RS-MMC, MMC-micro, or eMMC), an SD card (SD, miniSD, microSD, or SDHC), a universal flash storage (UFS), or the like.

Figure 15:
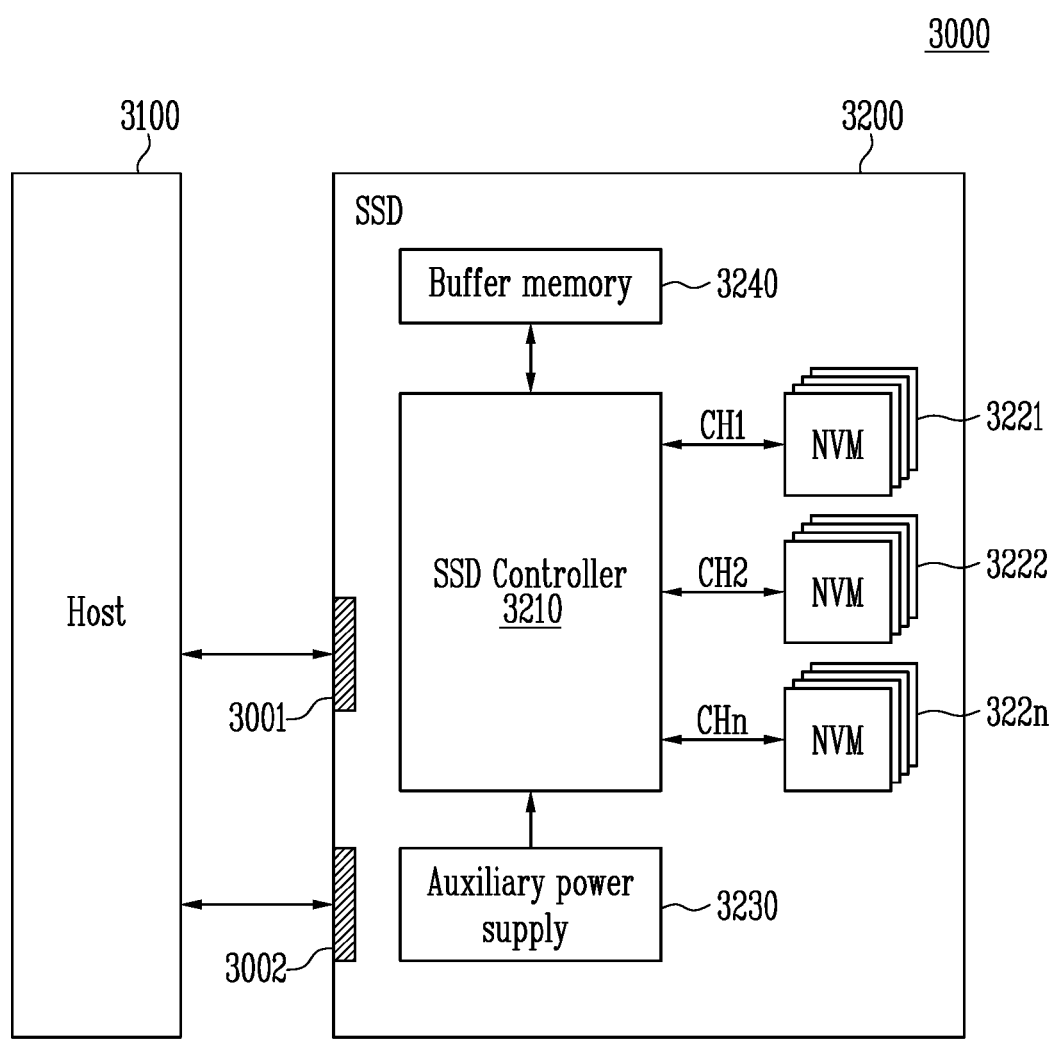
FIG. 15 is a block diagram illustrating a solid state drive (SSD) system to which the storage device according to an embodiment of the present disclosure is applied.

FIG. 15 is a block diagram illustrating a solid state drive (SSD) system 3000 to which the storage device according to an embodiment of the present disclosure is applied.

Referring to FIG. 15, the SSD system 3000 includes a host 3100 and an SSD 3200. The SSD 3200 exchanges a signal SIG with the host 3100 through a signal connector 3001 and receives power PWR through a power connector 3002. The SSD 3200 includes an SSD controller 3210, a plurality of non-volatile memories (NVMs) 3221 to 322n, an auxiliary power supply 3230, and a buffer memory 3240. The plurality of non-volatile memories 3221 to 322n may be flash memories.

In an embodiment, the SSD controller 3210 may perform the function of the memory controller 200 described with reference to FIG. 1.

The SSD controller 3210 may control the plurality of flash memories 3221 to 322n in response to the signal SIG received from the host 3100. For example, the signal SIG may be signals defined based on an interface between the host 3100 and the SSD 3200. For example, the signal SIG may be a signal defined by at least one of interfaces such as a universal serial bus (USB), a multimedia card (MMC), an embedded MMC (eMMC), a peripheral component interconnection (PCI), a PCI express (PCI-E), an advanced technology attachment (ATA), a serial-ATA, a parallel-ATA, a small computer system interface (SCSI), an enhanced small disk interface (ESDI), integrated drive electronics (IDE), FireWire, a universal flash storage (UFS), Wi-Fi, Bluetooth, an NVMe, and so on.

The auxiliary power supply 3230 is connected to the host 3100 through the power connector 3002. The auxiliary power supply 3230 may receive the power PWR from the host 3100 and may be charged with the power PWR. The auxiliary power supply 3230 may provide power to the SSD 3200 when power supply from the host 3100 is not smooth. For example, the auxiliary power supply 3230 may be positioned in the SSD 3200 or may be positioned outside the SSD 3200. For example, the auxiliary power supply 3230 may be positioned on a main board and may provide auxiliary power to the SSD 3200.

The buffer memory 3240 operates as a buffer memory of the SSD 3200. For example, the buffer memory 3240 may temporarily store data received from the host 3100 or data received from the plurality of flash memories 3221 to 322n, or may temporarily store metadata (for example, a mapping table) of the flash memories 3221 to 322n. The buffer memory 3240 may include a volatile memory such as a DRAM, an SDRAM, a DDR SDRAM, an LPDDR SDRAM, a GRAM, or the like, or a non-volatile memory such as an FRAM, a ReRAM, an STT-MRAM, a PRAM, or the like.

Figure 16:
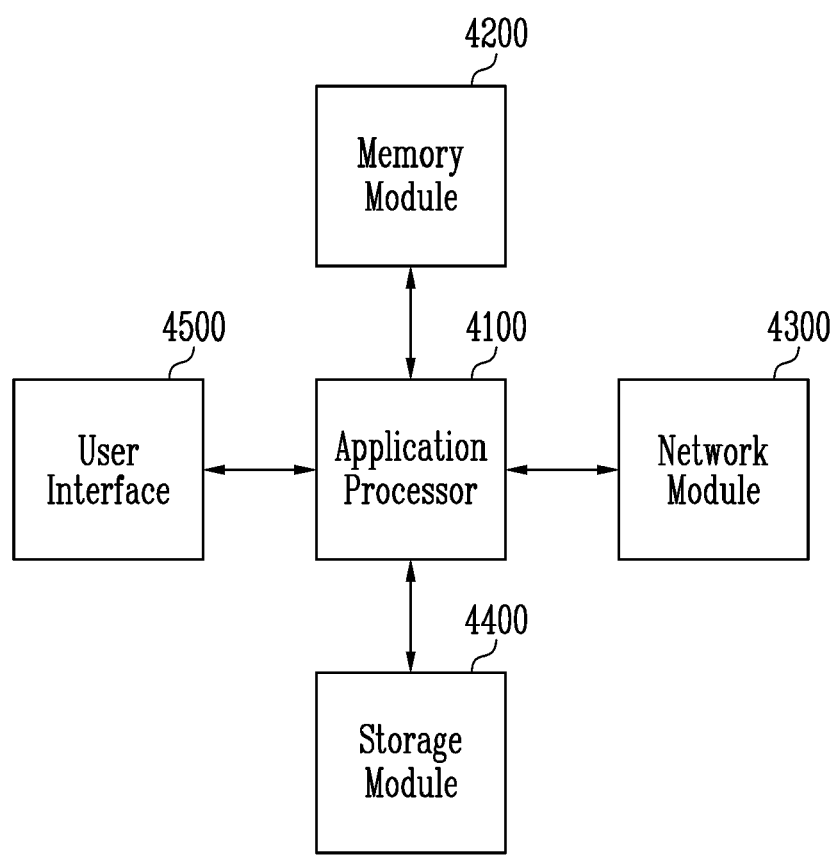
FIG. 16 is a block diagram illustrating a user system to which the storage device according to an embodiment of the present disclosure is applied.

FIG. 16 is a block diagram illustrating a user system 4000 to which the storage device according to an embodiment of the present disclosure is applied.

Referring to FIG. 16, the user system 4000 includes an application processor 4100, a memory module 4200, a network module 4300, a storage module 4400, and a user interface 4500.

The application processor 4100 may drive components, an operating system (OS), a user program, or the like included in the user system 4000. For example, the application processor 4100 may include controllers, interfaces, graphics engines, and the like that control the components included in the user system 4000. The application processor 4100 may be provided as a system-on-chip (SoC).

The memory module 4200 may operate as a main memory, an operation memory, a buffer memory, or a cache memory of the user system 4000. The memory module 4200 may include a volatile random access memory such as a DRAM, an SDRAM, a DDR SDRAM, a DDR2 SDRAM, a DDR3 SDRAM, an LPDDR SDARM, an LPDDR2 SDRAM, an LPDDR3 SDRAM, or the like, or a non-volatile random access memory, such as a PRAM, a ReRAM, an MRAM, an FRAM, or the like. For example, the application processor 4100 and the memory module 4200 may be packaged based on a package on package (POP) and provided as one semiconductor package.

The network module 4300 may communicate with external devices. For example, the network module 4300 may support one or more of wireless communications such as code division multiple access (CDMA), global system for mobile communications (GSM), wideband CDMA (WCDMA), CDMA-2000, time division multiple access (TDMA), long term evolution, Wimax, WLAN, UWB, Bluetooth, Wi-Fi, and so on. In another embodiment, the network module 4300 may be included in the application processor 4100.

The storage module 4400 may store data. For example, the storage module 4400 may store data received from the application processor 4100. Alternatively, the storage module 4400 may transmit data stored in the storage module 4400 to the application processor 4100. For example, the storage module 4400 may be implemented as a non-volatile semiconductor memory such as a phase-change RAM (PRAM), a magnetic RAM (MRAM), a resistive RAM (RRAM), a NAND flash, a NOR flash, a three-dimensional NAND flash, or the like. In another embodiment, the storage module 4400 may be provided as a removable storage device (or removable drive) such as a memory card, and an external drive of the user system 4000.

For example, the storage module 4400 may include a plurality of non-volatile memory devices, and the plurality of non-volatile memory devices may operate identically to the memory device 100 described with reference to FIG. 2. The application processor 4100 and the memory module 4200 may correspond to the memory controller 200 described with reference to FIG. 1.

The user interface 4500 may include interfaces for inputting data or an instruction to the application processor 4100 or for outputting data to an external device. For example, the user interface 4500 may include one or more user input interfaces such as a keyboard, a keypad, a button, a touch panel, a touch screen, a touch pad, a touch ball, a camera, a microphone, a gyroscope sensor, a vibration sensor, a piezoelectric element and so on. The user interface 4500 may include one or more user output interfaces such as a liquid crystal display (LCD), an organic light emitting diode (OLED) display device, an active matrix OLED (AMOLED) display device, an LED, a speaker, a monitor, and so on.

What is claimed is:

1. A memory controller that controls a memory device, the memory controller comprising:
a write buffer to temporarily store write data received from a host;
a write timing controller to receive temperature information indicating a temperature of the memory device, determine a target time interval corresponding to the temperature information, the target time interval indicating an interval between write timings at which the write data is transferred to the memory device, and generate write timing information indicating a write timing at which the write data is transferred at each target time interval; and
a write operation controller to control the write buffer to transfer the write data to the memory device at the write timing.

2. The memory controller of claim 1, wherein the write timing controller comprises:
a reference time interval table storage to store a reference time interval table that includes information on a plurality of reference time intervals respectively corresponding to a plurality of temperature ranges of the memory device; and
a reference time interval determiner to determine, as the target time interval, a reference time interval corresponding to the temperature information with reference to the reference time interval table.

3. The memory controller of claim 2, wherein as the temperature of the memory device decreases, the reference time interval corresponding to the temperature of the memory device decreases.

4. The memory controller of claim 2, wherein when a size of the write data is less than a size of a page included in the memory device, the write operation controller generates dummy data, and controls the write buffer and the memory device such that the write data and the dummy data are transferred to and stored in the memory device.

5. The memory controller of claim 4, wherein the write operation controller comprises a write data monitoring component to monitor the size of the write data stored in the write buffer,
wherein the write operation controller generates the dummy data having a size that is the same as a difference between the size of the page and the size of the write data.

6. The memory controller of claim 1, further comprises a temperature information obtaining component transfers a temperature information request command to the memory device, and receives the temperature information from the memory device as a response to the temperature information request command.

7. A method of operating a memory controller controlling a memory device, the method comprising:
storing write data received from a host in a write buffer;
receiving temperature information indicating a temperature of the memory device;
determining a target time interval corresponding to the temperature information, the target time interval indicating an interval at which a write timing is determined;
determining the write timing indicating a time point at which the write data stored in the write buffer is to be transferred to the memory device, according to the target time interval;
controlling the write buffer to transfer the write data stored in the write buffer to the memory device at the write timing in response to determining the write timing; and
transferring a program command instructing to store the write data transferred from the write buffer to the memory device.

8. The method of claim 7, wherein determining the target time interval comprises:
- determining the target time interval corresponding to the temperature information with reference to a reference time interval table that includes a plurality of reference time intervals respectively corresponding to a plurality of temperature ranges of the memory device.

9. The method of claim 8, wherein controlling the write buffer comprises:
- generating dummy data when the size of the write data is less than a size of a page included in the memory device; and
- controlling the write buffer to transfer the write data and the dummy data to the memory device,
- wherein transferring the program command comprises transferring the program command instructing to store the write data and the dummy data transferred from the write buffer to the memory device.

10. The method of claim 9, wherein generating the dummy data comprises:
- obtaining the size of the write data stored in the write buffer; and
- generating the dummy data having a size that is the same as a difference between the size of the page and the size of the write data.

11. The method of claim 10, wherein the page is one of a physical page and a logical page.

* * * * *